United States Patent [19]

Velie

[11] Patent Number: 4,875,982

[45] Date of Patent: Oct. 24, 1989

[54] PLATING HIGH ASPECT RATIO HOLES IN CIRCUIT BOARDS

[75] Inventor: Larry N. Velie, El Toro, Calif.

[73] Assignee: Velie Circuits, Inc., Costa Mesa, Calif.

[21] Appl. No.: 11,887

[22] Filed: Feb. 6, 1987

[51] Int. Cl.⁴ .................... C25D 5/02; C25D 17/00
[52] U.S. Cl. .................................... 204/14; 204/24; 204/273
[58] Field of Search ............ 204/15, 20, 24, 275, 204/273, 40

[56] References Cited

U.S. PATENT DOCUMENTS 4,397,715  8/1983  Mohan et al. ................ 204/24
4,445,978  5/1984  Whartenby et al. ........... 204/24

Primary Examiner—T. M. Tufariello
Attorney, Agent, or Firm—Jackson & Jones

[57] ABSTRACT

A novel product and product by process is disclosed. The product is a uniform electrically-conductive coating on an insulative substrate, which coating is formed onto a printed circuit substrate having high aspect ratio holes (with an aspect ratio of 6:1 or higher) therein.

Planting of high aspect ration holes is accomplished by offset longitudinally spaced-apart manifolds submerged in an electrolyte bath together with the printed circuit substrate moving back and forth in the space between the manifolds. A pump in a closed circulation system creates a vacuum in each manifold. The manifold portions adjacent to the printed circuit substrate include slots in a smooth curved front nose of the manifold to cause the electrolyte to be moved through the holes and in a sweeping vortex movement across the board's surface nearest to the manifold slots. A vacuuming action in the offset manifolds together with sufficient board movement assures a 1:1 ration of electroplating on the board's surface and in the hole walls of the high aspect ratio holes.

26 Claims, 1 Drawing Sheet

PLATING HIGH ASPECT RATIO HOLES IN CIRCUIT BOARDS

BACKGROUND OF THE INVENTION

1. Origin of the Invention

This invention was conceived by a sole inventor to solve a heretofore unsolved problem. A method, apparatus and product by process pertaining to electro-depositing copper on the hole walls of high aspect ratio holes drilled in electrical circuit substrates is disclosed.

2. Field of the Invention

The field of this invention, in general, is plating and, specifically, plating an electrically conductive material on surfaces, such as the hole walls, of a printed circuit substrate. The field of the invention is more particularly defined as relating to electrically conductive plating on rigid or flexible insulating circuit substrates having high aspect ratio holes therein. Aspect ratio, as used herein, is defined as the hole diameter to printed circuit substrate thickness, and high means that the ratio is in excess of four (4) or five (5) to one (1).

3. Description of the Prior Art

It is commonly known to formulate electrically conductive printed circuits on an insulative material in the form of a thin, flat layer (such as a layer of epoxy-glass or other comparable insulative material). One or more layers of electrically conductive material are formed in an electrical surface configuration on the insulative material. In its most common configuration, a flat, rigid layer of epoxy-glass material forms the insulative substrate and a double-sided, customly-designed copper configuration is the electrically conductive material. To mount electrical circuit components on the printed circuit board, a plurality of small holes, conforming to a component's mounting pattern, are drilled through the circuit board. Well-known soldering techniques mechanically and electrically secure the component's mounting leads to the walls of the hole to provide a completed electrical circuit on the printed circuit board. It is a common industry requirement that the walls of the holes and the board's surface must both be copper plated to a uniform and a minimum depth of at least 0.001 inches.

As technology has advanced, the number, size and density of the mounting holes have changed rather dramatically. Most notably, the diameter of the holes has decreased and the numbers of such holes per unit area of the board's surface has increased. A hole having, for example, a 0.009 inch diameter drilled through a substrate of 0.090 inch thickness has an aspect ratio of 10:1 (hereinafter called a "10:1" hole). These high aspect ratio holes are increasing in importance in today's advanced technology. Conventional plating techniques by very good quality printed circuit houses do not achieve satisfactory plating of 6:1 or higher holes.

Another aspect of today's technology in the printed circuit industry is called an optimum plating ratio. A desired ratio of 1:1 is a recognized industry standard. This ratio is a comparison of the thickness of copper deposition on the exposed surface of the copper layer with the thickness of copper deposition on the interior surface of the walls of the hole. Since the exposed copper area more readily receives copper deposition than does the innermost wall area of a hole, the 1:1 ratio is difficult to attain.

Suffice it to say at this point that high aspect ratio holes at a 1:1 ratio in prior art plating techniques have not been achieved. Such prior art attempts are hindered by "Dog Boning." "Dog Boning" creates a non-uniform copper buildup at the edges of the wall of the hole on the substrate. The non-uniform build up results primarily from a high electro-deposition current which is present at the edges of the hole. A concentration of high current at the transverse edges of the hole results in a surplus of electro-deposited copper at those edges as compared to the middle area of the hole's wall. Moreover, the build-up itself progressively hinders the internal deposition process until, in extreme instances, the hole becomes blocked. Such prior art boards do not meet the quality control requirements for today's technology.

Production speed in some printed circuit plating houses is achieved by employing a pressurized manifold submerged in an electrolyte plating tank. High amperage levels are employed in an attempt to enhance the deposition speed of copper to the 0.001 inch minimum required on printed circuit boards. As an incident to such high speed production, attempts have been made to use a sheet-shaped pressure manifold that is provided with a customized hole pattern which precisely matches the hole pattern in the flat surface of the printed circuit to be coated. The theory is that the pressure will force electrolyte through the holes and thus the walls of the hole will be uniformly plated. Such custom drilled manifolds are extremely costly to produce. Any change in the hole pattern or board dimensions results in a costly redesign of the manifold. Additionally, any misalignment of the board holder relative to the submerged custom-drilled manifold causes the high pressure near the hole locations to be misdirected into perpendicular spraying against the board's surface. Non-uniform and unacceptable plating often results.

In another prior art system, manifolds are placed on opposite sides of a board which is connected to receive a high amperage current. The deposition current in the industry is related to the square footage of the board. In the prior art, approximately 90 amperes per square foot ("ASF") is employed together with a positive pressure system. This prior art is called high impingement rate plating. The impingement is caused by a positive pressure applied to one or both of the manifolds. In some instances, one manifold has a positive pressure while the opposing in-line manifold has a negative pressure. In some systems a plurality of opposing manifolds stagger the positive and negative pressures so that adjacent in-line opposing manifold pairs alternate between positive and negative pressures. It is believed that the high amperage and the positive pressure blasting of electrolyte against the board's surface has prevented this prior art approach from achieving the novel results of the present invention.

In summary, the aforementioned prior art approaches are not only costly but are ineffective in achieving uniform minimum 1:1 plating on substrates with high aspect ratio holes, of about 5:1 and higher.

SUMMARY OF THE INVENTION

A novel product is disclosed. The product is an electrically conductive coating on an insulative substrate, which coating if formed into a printed circuit having therein high aspect ratio holes (with an aspect ratio of about 6:1 or higher) all plated to a minimum acceptable thickness (1:1 or more).

The product is achieved by the process steps of:

(a) precoating a thin, uniform layer of copper over the entire surface of said printed circuit substrate, (b) applying cathode current to said precoated printed circuit substrate, (c) submerging said cathode in a electrolyte bath, (d) offsetting a pair of spaced-apart manifolds in said electrolytic bath so that a longitudinal slot in each manifold of the offset pair faces toward a common plane which is adapted to receive a printed circuit substrate to be coated, (e) moving a printed circuit board transversely to the longitudinal slots in said offset manifolds so that the printed circuit board and the holes therein alternately pass in front of both of said manifold slots, and (f) withdrawing electrolyte from each of said offset manifolds so that electrolyte on the unblocked bath side of the printed circuit substrate opposite said manifold slot is sucked from the unblocked bath through the holes in said printed circuit substrate and is also swept into said manifold slot along the surface of said printed circuit board adjacent to said manifold slot.

The successful plating of high aspect ratio holes in accordance with my invention is attributed to a closed circulation system which includes the offset longitudinally spaced-apart manifolds submerged in the electrolyte bath together with means for moving the printed circuit back and forth in the space between the manifolds. A pumping system creates a vacuum in each manifold so that the electrolyte is moved through the holes and is swept in a vortex movement across the board's surface nearest to the slots in the offset manifolds of the manifold pair. A vacuuming action in both of the offset manifolds together with sufficient board movement to expose both sides of a common area of said printed circuit substrate to said washing action assures the uniform or 1:1 ratio electroplating on the board's surface and in the walls of the hole of the high aspect ratio holes in said printed circuit substrate.

While prior art conventional plating techniques are not successful beyond 4:1, 5:1 or 6:1 aspect ratio holes, my invention has successfully produced 1:1 ratio boards having 14:1 aspect ratio holes therein. Use of a low of fifteen to a high of thirty ampere cathode current applied to the board with a vertical movement of the depth of the board somewhat is excess of the center-to-center spacing of the offset between the slots in the manifold pair successfully plates, in about 65 to 70 minutes, the copper to the 0.001 inch thickness on the board surface and in the walls of the hole. Conventional processes, if successful at all, normally take from two to eight hours to accomplish the same task.

BRIEF DESCRIPTION OF THE DRAWING

FIGS. 5A through 5D, depicts, in cross section, alternate shapes for manifolds in accordance with this invention.

DETAILED DESCRIPTION OF THE DRAWING

Figure 1:
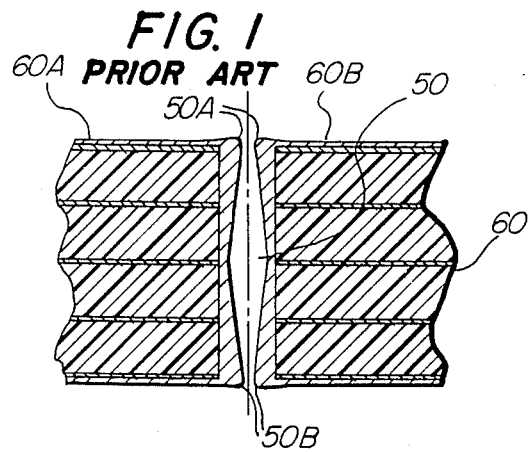
FIG. 1 is a cross section of a hole in a circuit board showing the "Dog Boning" effect of the prior art.

FIG. 1 is a cross section showing, in a simplified manner, the non-uniform plating by conventional prior art on a high aspect ratio hole 50. After a board 60 has been precoated in any well-known manner with a thin, uniform layer of copper, the precoated board 60 is electrically connected to a direct current source. For example, the precoated conductive board may be connected to a voltage source provided by a direct current rectifier fed by conventional AC power. Current concentrates at an increased amount at the edges of the very small holes such as hole 50, FIG. 1. As shown in the cross section of hole 50, the edges 50A, 50B receive increased plating action with respect to adjacent exposed surface areas such as areas 60A, 60B.

Figure 2:
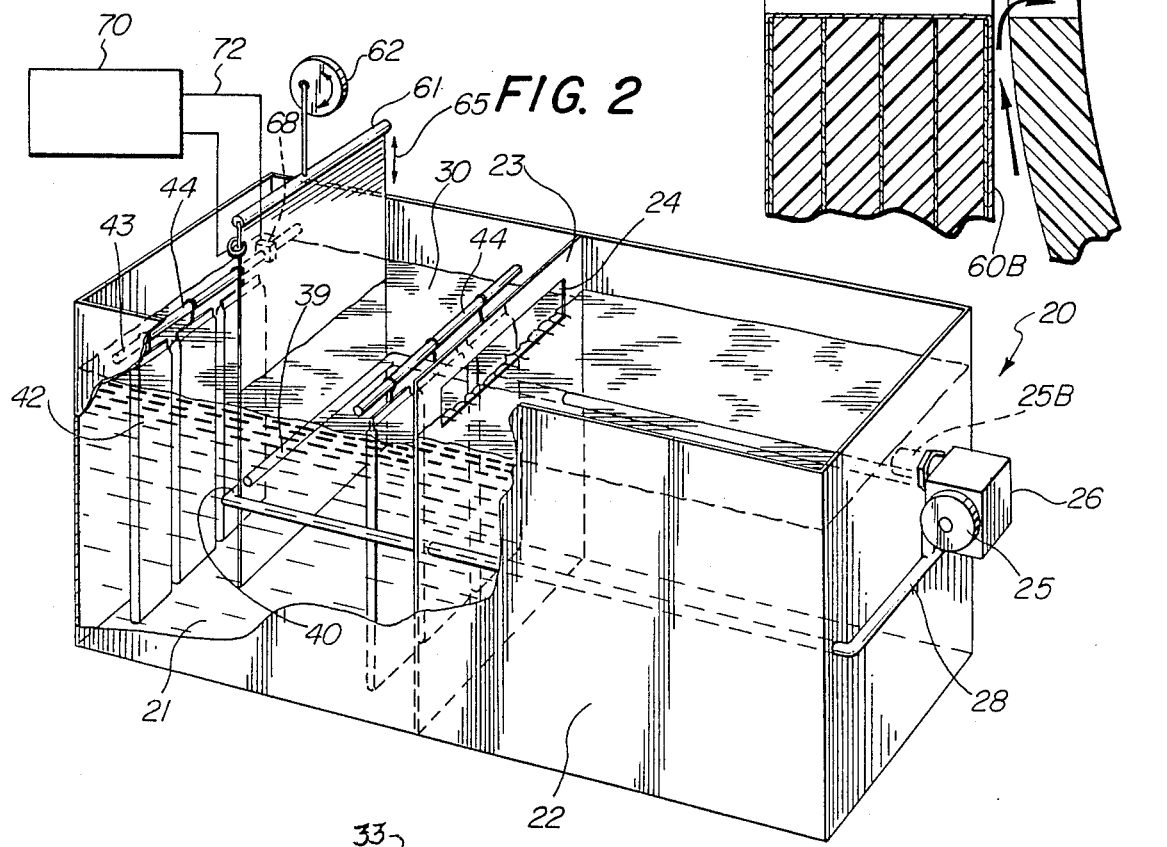
FIG. 2 is a partially cutaway perspective of a plating tank in accordance with this invention.

FIG. 2 depicts a partially cut away perspective of an electroplating tank 20 adapted to coat a printed circuit board 60 in accordance with this invention. Although highly simplified to demonstrate the essential features of my invention, it should be understood that high production capabilities may readily be achieved by duplicating and enlarging the apparatus of FIG. 2 to accommodate a large number of printed circuits being simultaneously plated during one plating cycle.

Tank 20 includes two sections, namely a plating cell section 21 and a electrolyte return cell 22. Any suitable electrolyte 30 fills the two cells 21 and 22 to an appropriate level as shown. Separating the two cells 21, 22 is a partition 23 having a weir opening 24 therein so that the electrolyte level in the return cell 22 is at a slightly higher electrolyte level than the electrolyte level in the plating cell 21. Outlet side 25B of pump 25 returns the electrolyte that is withdrawn from the plating cell 21 to the return cell 22 by a pair of manifolds 39 and 40. It should be understood that appropriate pumps including filtering 26 can be readily provided in any well-known manner available in the plating art. Particulate in the electrolyte tends to be filtered out by filter 26 and any particulate that remain after filtering tends to settle out in the return cell 22.

Inlet side 28 of pump 25 is connected to a pair of offset manifolds 39, 40. Electrolyte 30 from cell 21 is withdrawn through longitudinal slots in the manifold pair 39, 40 and is pumped to the return cell 22 in a closed circulation system. Any suitable pump capable of circulating the electrolyte 30 with sufficient suction to vigorously withdraw electrolyte 30 may be used. In my preferred embodiment, a pump rated at 2,000 gallons per hour was employed.

Located within plating cell 21 are porous containers 42 suspended from a holding rod 43 by suitable hooks 44. Within containers 42 are copper shavings or other suitable copper forms which are adapted to be soluble in electrolyte 30. That soluble copper in electrolyte 30, in a well-known fashion, is electroplated on the surface of an energized board 60.

A board 60 is suitably suspended from a holder 61 which in turn is driven by a vertical moving means 62. Typical motor, cam and linkage devices for imparting a predetermined vertical movement to board 60 (as shown by arrow 65) are well known and may be used. Any suitable, direct current source 70 supplies a direct current to the board 60 which has earlier been precoated with a copper layer that surrounds board 60. A suitable cable and clamp assembly 72 connect source 70 to board 60 and to a system ground 68. In my preferred embodiment, I found that 15 to 30 amperes applied to board 60 as a cathode in the electroplating system of this invention is sufficient.

Board 60 is moved vertically up and down between the manifold pair 39, 40. In my preferred embodiment, the cycle rate is between 24 cycles to 36 cycles per minute.

Figure 3:
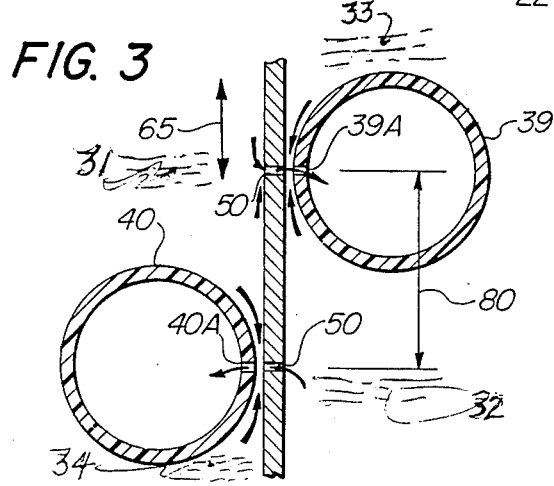
FIG. 3 is a highly schematic cross-sectional side view of a printed circuit board and offset manifold pair of FIG. 2.

FIG. 3 depicts a cross section taken along the center portion of manifolds 39, 40 of FIG. 2. In FIG. 3, the slots 39A and 40A that run longitudinally across the manifolds 39, 40 are shown as openings to withdraw electrolyte during the plating operation of this invention. The manifolds 39 and 40 are offset by distance 80. While the amount of offset is not critical, we have found that the offset amount 80 must, at a minimum, prevent one manifold's vacuuming action from interfering with the suction action in the other manifold. Thus, a manifold draws electrolyte from an unblocked bath region on the opposite side of the substrate being vacuum washed. Slot 39A of manifold 39 is free to draw electrolyte from the unemcumbered bath area 31, while slot 40A of manifold 40 freely draws electrolyte from an unemcumbered bath area 32. The absence of any interference in the unblocked areas 31, 32 for slots 39A and 40A plus relative movement of the printed circuit substrate between the offset manifolds are key features of my invention. Note also that the offset manifold provides freely circulating electrolyte 30 which is drawn from bath area 33 (above) and bath area 32 (below) manifold 39 into slot 39A. Electrolyte 30 is swept in a vortex action along the surface of board 50, which surface is adjacent to slot 39. A similar vortex action takes place from areas 31 and 34 for slot 40A.

The spacing between manifolds 39, 40 should admit non-touching movement of board 60 between the slots in the manifold pair. The manifold currently in use is a 1 and ½ inch diameter PVC pipe which has a longitudinal slot of 0.050 inch width machined in the pipe. The manifolds are offset from one another, as shown at 80, by about ¼ of an inch and are spaced from each side of a printed circuit substrate panel by about 0.100 inch.

Note that the top of manifold 40 is positioned well below the inlet level of slot 39A in manifold 39. Each manifold is then able to withdraw electrolyte 30 through the holes, such as hole 50, in board 60. The amount of movement 65 to board 50 is sufficient to present all holes in board 60 first to one manifold 39 and then to the other manifold 40. Alternately withdrawing electrolyte 30 from opposite sides of a board 60, it is believed, increases the total flow action per unit time of electrolyte through the holes in board 60. The result is that suitable 1:1 ratio plating of high aspect ratio holes is possible for the first time with my invention. I have also discovered that the offset location of manifolds 39, 40 promotes a uniform surface coating of copper on the flat exposed areas 60A, 60B (FIG. 4) of the board 60.

Figure 4:
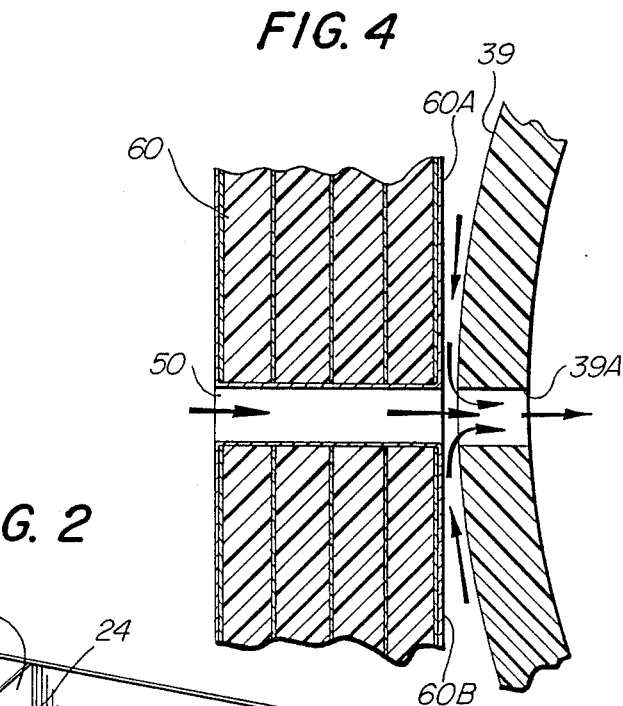
FIG. 4 depicts, in an enlarged view, the desired plating achieved by the process and apparatus of this invention.

FIG. 4 depicts an enlarged view of slot 39A in manifold 39. The arrows of FIG. 4 schematically illustrate the total straight-through and vortex flow of elecrolyte 30 through hole 50 and along the surfaces 60A, 60B of board 60 into manifold slot 39A. A highly uniform 1:1 ratio board is obtained without the "Dog Boning" effect of the prior art as shown and described earlier with respect to FIG. 1. Opposite sides of board 60 are alternately exposed to slots 39A and 40A in the offset manifold pair. Vertical movement 65 obviously is relative between the board 60 and manifolds 39, 40. The manifolds could be vertically moved to vacuum wash a stationary board 60 in keeping with this invention. Likewise the single board example of FIG. 2 is only illustrative of my invention and is not to be taken as limiting or excluding high production capabilities for my invention.

Although jigs for holding flexible printed circuits have not been shown, such holders are well within the skill of those versed in the plating art. In a similar manner, slides and fixtures to impart the required reciprocal movement of a rigid or flexible printed circuit are not shown but are readily within skill in this art. The invention is not to be taken as limited to relative vertical movement as horizontal or other suitable angular movement will also suffice.

Figure 5:
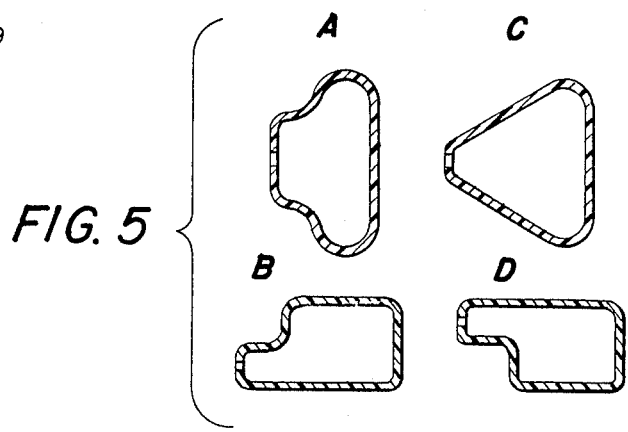
FIG. 5, including

While the manifolds 39, 40 of my description are shown as circular in cross section, they may also have flat, cone or combinational cross sections as depicted in FIGS. 5A, 5B, 5C and 5D of FIG. 5. The point to be appreciated is that vacuum or suction washing of opposed sides of a board by offset manifolds provides unblocked bath areas wherein the manifolds do not interfere with each other. The additional point of merit to be noted is that I employ a manifold shape which provides a sweeping vortex movement of electrolyte along the surface of the board adjacent to the manifold. Each of the manifold's slots in the manifold shapes A through D of FIG. 5 are located in a curved and smooth nose portion to promote a smooth, vortex sweeping of electrolyte along the board's surface and into a manifold slot.

The above description presents the best mode contemplated in carrying out my invention. My invention is, however, susceptible to modifications and alternate constructions from the embodiments shown in the drawings and described above. Consequently, it is not the intention to limit the invention to the particular embodiments disclosed. On the contrary, the invention is intended and shall cover all modifications, sizes and alternate constructions falling within the spirit and scope of the invention, as expressed in the appended claims when read in light of the description and drawings.

What is claimed is:

1. A product by process comprising an electrically-conductive coating on a printed circuit substrate of dielectric material, said substrate having therein high aspect ratio holes plated to an essentially uniform thickness by the process steps of:
   (a) precoating a thin, uniform electrically-conductive layer over the surface of said dielectric printed circuit substrate,
   (b) energizing said precoated printed circuit substrate with a plating current,
   (c) submerging said energized substrate in an electrolyte bath,
   (d) submerging manifolds in said electrolyte bath such that the manifolds are spaced and offset from one another,
   (e) connecting each of the manifolds to a negative pressure source, and
   (f) vacuum washing opposite sides of the printed circuit substrate in order to suction the electrolyte through the high aspect ratio holes in the substrate; and
   (g) moving the substrate relative to and between said spaced and offset manifolds while the suction of the offset manifolds is drawing the electrolyte through the high aspect ratio holes and thereby plating the holes to an essentially uniform amount.

2. The product by process in accordance with claim 1 and further comprising:
  placing a longitudinal slot in each offset manifold, which slots face toward a plane located between the manifolds, which plane is adapted to be reciprocally occupied by said printed circuit substrate to be plated.

3. The product by process of claim 2 and further comprising:
  cyclically moving a rigid substrate, or a flexible substrate held in tension to assume a rigid condition, back and forth in said plane so that the substrate's surfaces are vacuum washed during each cycle by the respective slots in said manifold pair.

4. The product by process in accordance with claim 2 and further comprising:
  moving a printed circuit substrate transversely to the longitudinal slots in said offset manifolds so that the printed circuit substrate and the holes therein pass in front of both of said manifold slots, and
  withdrawing electrolyte from said bath into said manifolds so that electrolyte from an unblocked bath area adjacent to the further removed surface of the substrate is sucked from the bath through the holes in said printed circuit into each manifold slot and on the manifold side of the printed circuit substrate, the electrolyte is swept along the surface of said board and into each manifold slot.

5. A product in accordance with claim 1 wherein the high aspect ratio is defined as a comparison between the hole's diameter and the thickness of the dielectric substrate material and further wherein
  said ratio is about 4:1 or higher.

6. The product of claim 5 wherein the aspect ratio is selected from a range of about 4:1 to 15:1 or higher.

7. The product of claim 6 wherein the electrically-conductive coating is copper, the substrate is a flat insulative sheet having said holes therethrough, and further wherein said uniform coating thickness is essentially the same within the interior surfaces of said holes as it is on the sheet's flat surfaces.

8. Apparatus for electrolytically forming an electrically-conductive coating on a printed circuit substrate having high aspect ratio holes therein, said apparatus comprising:
  means for applying plating current to a precoated printed circuit substrate having a thin, uniform electrically-conductive layer over the surface of said printed circuit substrate;
  means for submerging said energized substrate in an electrolyte bath; and
  a pair of manifold means on opposing sides of said substrate in said bath for vacuum washing the printed circuit substrate by withdrawing electrolyte from bath on both sides of said substrate, with the electrolyte being drawn into each manifold means from the bath through the holes in the substrate and along a surface of the substrate which is adjacent each of said manifolds.

9. Apparatus in accordance with claim 8 wherein said vacuum washing means further comprises:
  a pair of submerged manifolds with each manifold of the pair having a manifold opening facing toward a first plane located between the manifolds.

10. Apparatus in accordance with claim 9 and further comprising:
  means spacing each manifold opening in a separate plane of a pair of parallel second planes with said manifold openings being essentially transverse to said first plane.

11. Apparatus in accordance with claim 8 wherein said vacuum washing means further comprises:
  means connected to said manifold means and having a negative pressure therein for withdrawing electrolyte through and adjacent to the holes in said substrate.

12. Apparatus in accordance with claim 11 wherein said printed circuit substrate in a flat sheet and said vacuum washing means comprises:
  at least a pair of manifold means with one each being spaced from and on opposite sides of said printed circuit substrate and having manifold slots therein with both of said slots facing toward a common plane.

13. Apparatus in accordance with claim 12 and further wherein
  said pair of manifold means are each circular in cross section, and wherein said manifold slot openings in said circular cross sections are facing toward said common plane, which plane is essentially transverse to the direction that said slot openings of said pair are facing.

14. Apparatus in accordance with claim 12 and further wherein
  said pair of manifold means are each essentially conical in cross section with slot openings in a smooth and curved apex of the conical cross section, with the slot openings facing toward said common plane.

15. Apparatus in accordance with claim 10 and further wherein
  said manifold means include a smooth curved forward surface having an electrolyte admitting slot therein for sweeping the electrolyte in a vortex movement along the board's surface adjacent to said slot.

16. Apparatus in accordance with claim 8 and further comprising:
  a source of current selected between about fifteen amperes to about thirty amperes as said plating current.

17. Apparatus in accordance with claim 8 and further comprising:
  means for reciprocally moving said printed circuit substrate between said offset manifold means so that essentially the entire surface on both sides of the substrate is repeatedly washed by both of said manifold means.

18. Apparatus in accordance with claim 17 wherein said reciprocally moving means is further characterized as
  cycling said board at about twenty to thirty cycles per minute.

19. Apparatus in accordance with claim 5 wherein said electrolyte bath is a fluid held in a tank having separated plating and return sections and further comprising:
  a closed electrolyte circulation system including said manifold means for withdrawing said electrolyte fluid from said plating section and conduit means connected thereto for returning the withdrawn electrolyte to said return section of said tank; and
  a fluid communicating wier means between said tank's plating and return sections.

20. Apparatus for electrolytically forming an electrically-conductive coating on a printed circuit substrate having high aspect ratio holes therein, said apparatus comprising:

means for applying plating current to a precoated flat printed circuit substrate having a uniform electrically-conductive layer over the surface of said substrate;

means for submerging said energized substrate in a liquid electrolyte bath; and at least a pair of manifold means in said bath located on opposing sides of said substrate for simultaneously vacuum washing both sides of said substrate by withdrawing electrolyte through the holes in the substrate and along both of the opposing surfaces of the substrate.

21. A process for applying electrically-conductive coating on a printed circuit substrate having therein high aspect ratio holes plated to an essentially uniform thickness by the steps of:

(a) precoating a thin, uniform electrically-conductive layer over the surface of said printed circuit substrate, (b) energizing said precoated printed circuit substrate with a plating current, (c) Submerging said energized substrate in an electrolyte bath, (d) placing suction manifolds in said electrolyte bath so that the manifolds are spaced and immediately offset adjacent one another, (e) connecting each of the manifolds to a suction source, and (f) vacuum washing opposite sides of the printed circuit substrate by moving the substrate's high aspect holes between said offset suction manifold.

22. The process in accordance with claim 21 and further comprising of the additional step of:

placing a longitudinal slot in each offset suction manifold with the slots in each manifold, facing toward a place located between the manifolds; and reciprocally moving said printed circuit substrate to be plated in said plane so that the holes therein pass in front of each of said manifolds.

23. The process of claim 22 and further comprising the step of:

cyclically moving a rigid substrate, or a flexible printed circuit substrate held in tension to assume a rigid condition, back and forth in said place so that the substrate's surfaces are vacuum washed during each cycle only by the respective slots in said suction manifolds.

24. The process of claim 23 and comprising the additional steps of:

moving a printed circuit substrate transversely to the longitudinal slots in said offset manifolds so that the printed circuit substrate and the holes therein pass in front of both of said manifold slots; and withdrawing electrolyte from said bath into said manifolds so that electrolyte from an unblocked bath area adjacent to the further removed surface of the substrate is sucked from the bath through the holes in said printed circuit into each manifold slot and on the manifold side of the printed circuit substrate, the electrolyte is sucked along the surface of said board and into each manifold slot.

25. A process for electrolytically forming an electrically-conductive coating on a printed circuit substrate having high aspect ratio holes therein, said method comprising steps of:

applying cathode current to a precoated printed circuit substrata having a thin, uniform electrically-conductive layer over the surface of said printed circuit substrate;

submerging said energized substrate in an electrolyte bath;

placing at least a pair of immediately offset suction manifolds means on opposing sides of said substrate; and vacuum washing both sides of the printed circuit substrate by sucking electrolyte from bath areas on both sides of said substrate, with the electrolyte being drawn into each manifold means from the bath side of the substrate opposite of the manifold location through the holes in the substrate and on the bath side of the substrate which is adjacent to the manifold, along that adjacent surface of the substrate and into each manifold.

26. A process for electrolytically forming an electrically-conductive coating on a printed circuit substrate having high aspect ratio holes therein and method comprising the steps of:

applying plating current to a precoated flat printed circuit substrate having a uniform electrically-conductive layer over the surface of said substrate;

submerging said energized substrate in a liquid electrolyte bath;

a pair of manifold means in said bath located on opposing sides of said substrate; and simultaneously vacuum washing by both sides of said substrate by withdrawing electrolyte through the holes in the substrate and along both of the opposing surfaces of the substrate.

* * * * *

UNITED STATES PATENT AND TRADEMARK OFFICE
CERTIFICATE OF CORRECTION

PATENT NO. : 4,875,982

DATED : October 24, 1989

INVENTOR(S) : Larry N. Velie

It is certified that error appears in the above-identified patent and that said Letters Patent is hereby corrected as shown below:

Title page, ABSTRACT, line 6, "Planting" should read --Plating--.

Column 8, line 10, "in" should read --is--.

Column 8, line 56, "5" should read --11--.

Column 9, line 35, "manifold" should read --manifolds--.

Signed and Sealed this

Eighteenth Day of September, 1990

Attest:

HARRY F. MANBECK, JR.

*Attesting Officer*     *Commissioner of Patents and Trademarks*